United States Patent
Adriaens et al.

(10) Patent No.: US 7,352,473 B2
(45) Date of Patent: Apr. 1, 2008

(54) LITHOGRAPHIC APPARATUS, DEVICE MANUFACTURING METHOD, AND COMPUTER PROGRAM

(75) Inventors: Johannes Mathias Theodorus Antonius Adriaens, Eindhoven (NL); Marcel Hendrikus Maria Beems, Veldhoven (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 177 days.

(21) Appl. No.: 10/825,221

(22) Filed: Apr. 16, 2004

(65) Prior Publication Data

US 2005/0002040 A1    Jan. 6, 2005

(30) Foreign Application Priority Data

Apr. 17, 2003   (EP)   .................................. 03252474

(51) Int. Cl.
*G01B 11/02* (2006.01)

(52) U.S. Cl. .................................................... 356/500

(58) Field of Classification Search ................ 356/496, 356/498, 500
See application file for complete search history.

(56) References Cited

U.S. PATENT DOCUMENTS

| | | | |
|---|---|---|---|
| 5,363,196 A | 11/1994 | Cameron | |
| 5,764,361 A | 6/1998 | Kato et al. | |
| 6,906,784 B2 * | 6/2005 | Hill | 355/53 |
| 2002/0033951 A1 | 3/2002 | Hill | |
| 2002/0167675 A1 | 11/2002 | Inoue et al. | |

FOREIGN PATENT DOCUMENTS

JP    2002-365016    12/2002

\* cited by examiner

*Primary Examiner*—Michael A. Lyons
(74) *Attorney, Agent, or Firm*—Pillsbury Winthrop Shaw Pittman LLP

(57) ABSTRACT

In an interferometric displacement measuring system, a correction for beamshear is made. The correction may be a polynomial of a variable proportional to the length of the optical path traversed by the measurement beam and the angle of the measurement mirror. The correction compensates for errors caused by non-planarity of the wavefront of the measurement beam.

20 Claims, 2 Drawing Sheets

LITHOGRAPHIC APPARATUS, DEVICE MANUFACTURING METHOD, AND COMPUTER PROGRAM

BACKGROUND OF THE INVENTION

1. Field of the Invention

The present invention relates to a lithographic projection apparatus including an interferometric displacement measuring system configured to measure displacements of a moveable component of the apparatus and including a model, the relating sensor measurements to displacements of the moveable component.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device include a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning devices as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796.

In order to print the pattern used to form a device layer accurately on top of previous layers formed on the substrate, it is essential to know the positions of the mask (or patterning means) and substrate throughout the exposure process. To this end, in many known lithographic apparatus displacements of the mask and substrate tables are continuously measured using interferometer based systems. An example of such a system is disclosed in "Overlay and Field by Field Leveling in Wafer Steppers using an Advanced Metrology System" by M. A. van den Brink, et al presented at SPIE Symposium on Microlithography, March 1992, San Jose, Calif. USA. The six-degree of freedom interferometer system described therein uses double path interferometers and large beam sizes so that there remains sufficient overlap between measuring and reference beams even in the event of misalignment of the interferometer caused by the changing angles of the measuring mirrors fixedly mounted on the substrate table when it rotates. The aim of this, based on a simplified theory, assuming flat and parallel wavefronts, is that the effect of beamshear due to tilts of the measurement mirrors does not affect the results of the displacement measurements. There may be a reduction in signal level, but no phase shift. However, the present inventors have determined that in such a measuring system, tilts of the measuring mirrors do affect the measured displacements, for example due to wavefront curvature.

SUMMARY OF THE INVENTION

It is an aspect of the present invention to provide an interferometric displacement measuring system in which the effects of mirror inclination are removed or ameliorated.

This and other aspects are achieved according to the present invention in a lithographic apparatus including a radiation system configured to provide a beam of radiation; a support configured to support a patterning device, the patterning device configured to pattern the beam of radiation according to a desired pattern; a substrate table configured to hold a substrate; a projection system configured to project the patterned beam onto a target portion of the substrate; and an interferometric displacement measuring system configured to measure displacements of a moveable component of the apparatus and including a model, the model incorporates at least one correction term that is a function of a variable representing beamshear of a measurement beam of the interferometric displacement measuring system.

The present inventors have determined that even with known arrangements to position or displacement measurements in an interferometer being affected by tilt of the measuring mirror, significant errors can be introduced when the measuring mirror is not exactly perpendicular to the measuring beam. In commercial plane mirror interferometers, the use of corner cubes to send the measuring beam over the measurement path twice prevents tilt of the wavefront of the measuring beam. Known models which compensate for geometry errors due to non-perpendicularity of interferometer axes and reflectivity mirrors, are based on simplified theory assuming planar and parallel wavefronts. Any deviation from planarity, e.g. because of errors in beam pointing, or asymmetric beam curvature in one or two dimensions, can cause positioning errors in the event of beamshear. According to the present invention therefore, a correction is introduced into the interferometer models in the form of one or more correction terms depending on beamshear, that is the effect of measuring mirror tilt.

In a preferred embodiment, the correction terms are functions of a variable that is proportioned to at least one, and preferably all, of: the length of the optical path between a fixed part of the interferometer and the measuring mirror, the number of passes of that path that are made by the measuring beam and the angle between the measurement beam and the measuring mirror. In this way, the variable represents the offset of the measuring and reference beams where they interfere and can accurately characterize the errors.

It is also preferred that separate corrections in two orthogonal directions are effected since the causes of tilt-induced errors may differ in different directions. Also, the correction term is preferably a polynomial, e.g. of second or higher order, in the variable representing beamshear which enables an easy fitting of coefficients during initial or periodic calibration of the machine.

Where the interferometer system measures several linear degrees of freedom, corrections are preferably made in all of them and are preferably taken into account in the derivation of rotational degrees of freedom from linear measurements.

According to a further aspect of the invention there is provided a device manufacturing method using a lithographic projection apparatus, the method including providing a substrate that is at least partially covered by a layer of radiation-sensitive material; providing a projection beam of radiation using a radiation system; using patterning means to endow the projection beam with a pattern in its cross-section; projecting the patterned beam of radiation onto a target portion of the layer of radiation-sensitive material; and measuring displacements of a moveable component of the lithographic projection apparatus using an interferometric displacement measuring system comprising a model, the model relating sensor measurements to displacements of the moveable component, wherein the model incorporates at least one correction term that is a function of a variable representing beamshear of a measurement beam of the interferometric displacement measuring system.

Yet a further aspect of the invention provides a computer program including a program code that, when executed on a computer system, instructs the computer system to calculate displacements of a moveable object in a lithographic projection apparatus from sensor measurements of an interferometric displacement measuring system calculate at least one correction term that is a function of a variable representing beamshear of a measurement beam of the interferometric displacement measuring system.

The computer program of the invention may be installed on existing lithography machines, as well as new ones, to enable "retrofitting" of the present invention as an upgrade.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
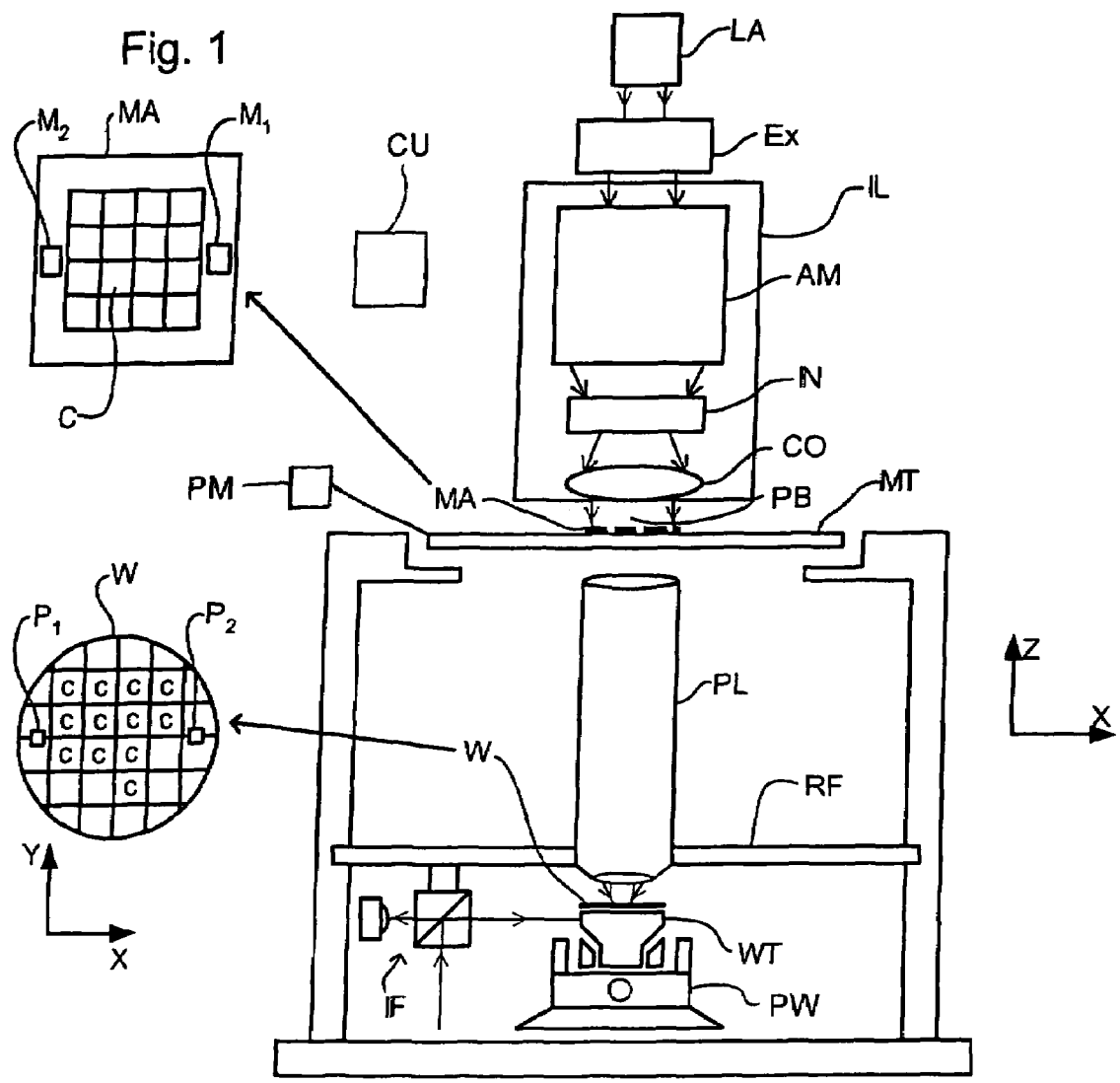
FIG. 1 depicts a lithographic projection apparatus according to an embodiment of the present invention.

FIG. 1 schematically depicts a lithographic projection apparatus according to an exemplary embodiment of the present invention including a radiation system Ex, IL to supply a beam PB of radiation (e.g. DUV radiation), which in this particular case also includes a radiation source LA. A first object table (mask table) MT is provided with a mask holder to hold a mask MA (e.g. a reticle), and is connected to a first positioning device PM that accurately positions the mask with respect to a projection system ("lens") PL. A second object table (substrate table) WT is provided with a substrate holder to hold a substrate W (e.g. a resist-coated silicon wafer), and is connected to second positioning device PW that accurately positions the substrate with respect to the projection system PL. The projection system ("lens") PL (e.g. a refractive lens system) is provided on a reference frame RF and images an irradiated portion of the mask MA onto a target portion C (e.g. including one or more dies) of the substrate W. A controller CU is configured to control various aspects and systems of the apparatus. The controller CU may be an application specific integrated circuit (ASIC) or may be a general purposed computer configured to run computer programs including codes that instruct the computer to perform various calculations and tasks.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an Hg lamp) produces radiation. This radiation is fed into an illumination system (illuminator) IL, either directly or after having traversed conditioning device, a beam expander Ex, for example. The illuminator IL may comprise an adjusting device AM to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
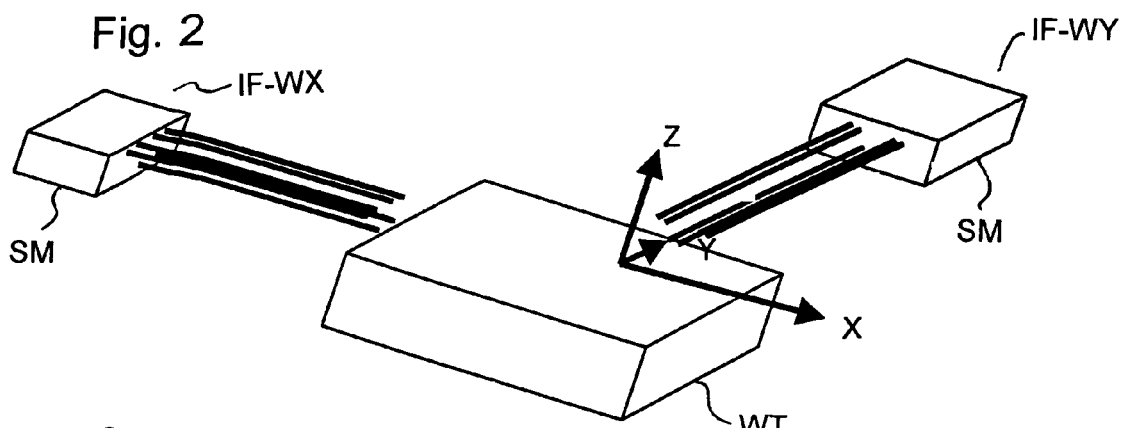
FIG. 2 depicts the substrate table of the apparatus in FIG. 1 and the arrangement of measurement beams in an interferometric displacement measuring system.
Figure 3:
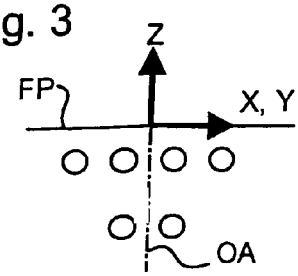
FIG. 3 depicts the pattern of beams incident on the table mirrors.

FIG. 2 is a schematic of part of the interferometer system IF-W which measures the displacements of the substrate table WT. Shown are the X and Y interferometers IF-WX, IF-WY each of which directs three measuring beams against plane mirrors fixed to the sides of the substrate table WT, which is referred to as the mirror block. The beams are incident on the plane mirrors in the pattern shown in FIG. 3. Note that six beams spots are shown because each measurement beam is directed from the beam source in the sensor module SM to the measurement mirror to be incident substantially normally thereon, the returned beam is then reflected back to the measuring mirror by a corner cube in the sensor module and finally is reflected back to the sensor module by the plane mirror to interfere with a reference beam. Movements of the substrate table alter the length of the path of the measuring beam so that interference fringes where the measuring and reference beams overlap shift. The position signal is therefore derived by counting fringes with a fixed detector.

The measuring beam makes four passes of the distance from sensor module to measuring mirror, so that the effect of movements of the measuring mirror is magnified fourfold in the fringe count. Also, the corner cube ensures that the beam returned to the sensor module for interference is parallel to the original incident beam irrespective of tilts of the measuring mirror. Therefore, a tilt of the substrate table results in a sideways shift of the measuring beam, which may reduce the overlap with the reference beam and hence the signal level, but no change in path length so in a theoretical simplified mode no phase change and no change in the position signal. However, the inventors have determined that a signal change is caused by beamshear and, according to the present invention, this is taken into account in the metrology model, the mathematical model used to convert the fringe counts of the interferometer system into stage position information.

Figure 4:
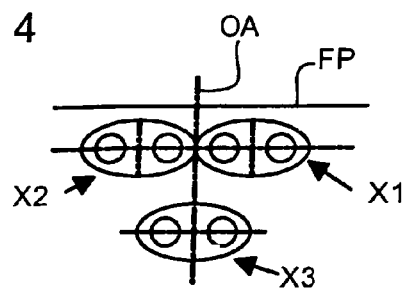
FIGS. 4, 5, 6 and 7 show the definitions of various variables used in the interferometer model.
Figure 5:
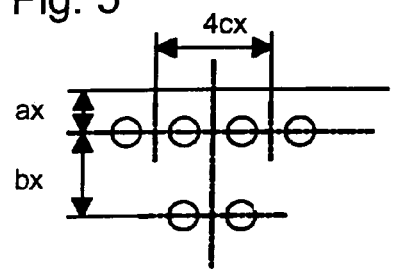
Figure 6:
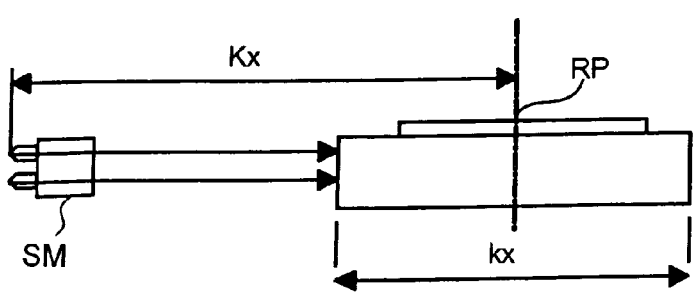

First, some definitions of variables are given with reference to FIGS. 4 to 6. These figures illustrate the X-interferometer—the Y-interferometer corresponds.

Figure 7:
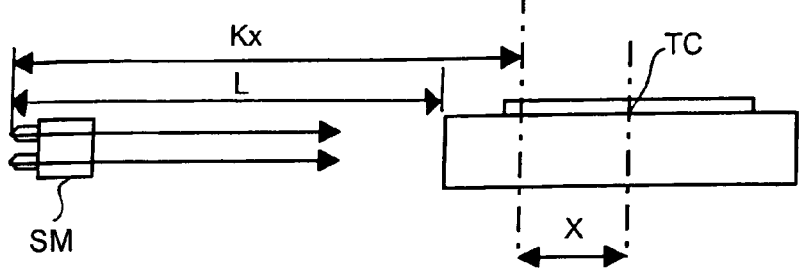

FIG. 4 shows how the six beam spots relate to the three X measurement axes X1, X2 and X3. Each axis effectively measures the position in the X direction of the measurement mirror on the center line between its two beam spots. The locations of these points are defined by the constants ax, bx and cx, shown in FIG. 5, relative to the optical axis OA of the projection system PL and the focal plane FP of the alignment sensor and projection system. The substrate table position is measured relative to an origin RP, referred to as the rotation point, which is the intersection of the optical axis OA and the focal plane FP of the alignment system or projection system. The distance between the sensor module and this point in the x plane is Kx and the width of the substrate table WT is kx. Corresponding constants, ay, by and cy are defined for the Y direction. Then, the position X of the substrate table in the x-direction is defined as shown in FIG. 7.

The interferometers use plane mirrors and are subject to accuracy problems in the nanometer area due to wavefront imperfections, such as errors in beam parallelism, asymmetric beam curvature in 1 or 2 dimensions and other effects, in combination with beamshear of the measurement beam relative to the reference beam. Beamshear may be caused by rotation of the object whose position is measured, and hence tilt of the measuring mirror.

According to the invention, this is compensated for by the addition, in the interferometer model for the X and Y-direction, of terms which contain first, second or higher order terms as a function of beamshear "BS". Beamshear is a consequence of a mirror-angle change (rotation), while the table is at a certain distance L from the sensor module. In this embodiment, beamshear BS is proportional to 4 times the beam path length of the sensor module to the measuring mirror times the table-angle (relative to the beam perpendicular to mirror situation) and can be two dimensional. For example, for the X interferometers shear of the measurement beam in Y due to Rz rotations and shear in Z due to Ry-rotations around the virtual rotation point RP occur. The BS in Y is about 4*Rz*L in which L is the optical path length between the table mirror and sensor module. A small internal interferometer shift term may also be added. The beamshear may also contain other parameters which are used in the interferometer model. For beamshear in Y, the additional model terms have the form:

$$ay^*(BS \text{ in } Y) + by^*(BS \text{ in } Y)^2 + \text{higher order terms}.$$

Similar terms for beamshear in Z are also added and for the Y-interferometer a similar addition of terms for beamshear in X and Z is done. During calibration of the interferometer model, position shifts as a function of stage rotation and stage position are determined. Interferometer model parameters and beamshear coefficients can be calibrated using a least square fit, or the parameters and coefficients can be calculated using estimation/calculation techniques known in the field of parameter estimation and/or signal processing.

A source of system failure in the interferometric displacement measuring system that the inventors have identified is ambient light reaching the sensors. The interferometer sensors and associated electronics are adapted to detect an oscillating signal and in particular to count fringes processing past the sensor as the table moves. This may be done by detecting the leading edges in the sensor signal as each bright fringe passes the detector. The interferometer is therefore relatively insensitive to constant or slowly-changing background illumination. However, the present inventors have determined that the fringe counting electronics may be confused by relatively brief and bright flashes of light scattered from the beam of radiation when a pulsed radiation source is used. To solve this problem, a filter is positioned at a convenient point in the path of the measuring beam, preferably close to the sensors. The filter may be a bandpass or long pass filter to allow the measurement beam through but block scattered radiation (stray light) from the beam of radiation, or any other source. Any intermittent optical source with sufficient intensity, either directly or via fluorescence, can cause the problem.

While specific embodiments of the invention have been described above, it will be appreciated that the invention may be practiced otherwise than as described. For example, the invention may be implemented in an interferometer system for measuring the position of the mask stage or any other moveable component in the apparatus. In general, the invention may be employed in a single axis interferometer when the beamshear is determinable, or a multi-axis interferometer, for example a 3-axis system determining X, Rz, Ry or a 5-axis system determining X, Y, Rz, Rx and Ry. The description is not intended to limit the invention.

What is claimed is:

1. A lithographic projection apparatus, comprising:
   a radiation system configured to provide a beam of radiation;
   a support configured to support a patterning device, the patterning device configured to pattern the beam of radiation according to a desired pattern;
   a substrate table configured to hold a substrate;
   a projection system configured to project the patterned beam onto a target portion of the substrate; and
   an interferometric displacement measuring system configured to measure displacements of a moveable component of the apparatus and comprising a model, the model relating sensor measurements to displacements of the moveable component, wherein the model incorporates at least one correction term that is a function of a variable representing beamshear of a measurement beam of the interferometric displacement measuring system, and the interferometric displacement measuring system is configured to determine displacements as a function of moveable component rotation and moveable component position, and to determine interferometer model parameters, including coefficients for terms dependent on a variable representing beamshear of a measurement beam, using a least square fit.

2. An apparatus according to claim 1, wherein the measurement beam traverses an optical path between a fixed part of the interferometric displacement measuring system and a measuring mirror fixed to the moveable component, and the variable representing beamshear is proportional to at least one of the length of the optical path, the number of passes of the optical path made by the measurement beam, and the angle between the measurement beam and the normal to the measuring mirror.

3. An apparatus according to claim 1, wherein the model includes correction terms that are functions of variables representing beamshear in at least two orthogonal directions.

4. An apparatus according to claim 1, wherein the correction term is a polynomial in the variable representing beamshear.

5. An apparatus according to claim 4, wherein the polynomial is at least second order.

6. An apparatus according to claim 1, wherein the interferometric displacement measuring system is configured to measure displacements in at least two linear degrees of freedom and the model includes respective correction terms for each of the linear degrees of freedom.

7. An apparatus according to claim 1, wherein the moveable component is the support or the substrate table.

8. A device manufacturing method using a lithographic projection apparatus, the method comprising:
   providing a substrate that is at least partially covered by a layer of radiation-sensitive material;
   providing a beam of radiation using a radiation system;
   using a patterning device to endow the projection beam with a pattern in its cross-section;
   projecting the patterned beam of radiation onto a target portion of the layer of radiation-sensitive material;
   measuring displacements of a moveable component of the lithographic projection apparatus using an interferometric displacement measuring system comprising a model, the model relating sensor measurements to displacements of the moveable component, wherein the model incorporates at least one correction term that is a function of a variable representing beamshear of a measurement beam of the interferometric displacement measuring system;
   determining displacements as a function of moveable component rotation and moveable component position; and
   determining interferometer model parameters, including coefficients for terms dependent on a variable representing beamshear of a measurement beam, using a least square fit.

9. A device manufacturing method according to claim 8, further comprising using the measured displacements to control movement of the moveable component.

10. A device manufacturing method according to claim 8, wherein the measurement beam traverses an optical path between a fixed part of the interferometric displacement measuring system and a measuring mirror fixed to the moveable component, and the variable representing beamshear is proportional to at least one of the length of the optical path, the number of passes of the optical path made by the measurement beam, and the angle between the measurement beam and the normal to the measuring mirror.

11. A device manufacturing method according to claim 8, comprising measuring displacements in at least two linear degrees of freedom and the model includes respective correction terms for each of the linear degrees of freedom.

12. A computer program embodied on a computer readable medium, comprising:
   a program code that, when executed on a computer system, instructs the computer system to calculate displacements of a moveable object in a lithographic projection apparatus from sensor measurements of an interferometric displacement measuring system, calculate at least one correction term that is a function of a variable representing beamshear of a measurement beam of the interferometric displacement measuring system, determine displacements as a function of moveable object rotation and moveable object position, and determine interferometer model parameters, including coefficients for terms dependent on a variable representing beamshear of a measurement beam, using a least square fit.

13. A device manufacturing method according to claim 8, wherein the model includes correction terms that are functions of variables representing beamshear in at least two orthogonal directions.

14. A device manufacturing method according to claim 8, wherein the correction term is a polynomial in the variable representing beamshear.

15. A computer program according to claim 12, wherein the measurement beam traverses an optical path between a fixed part of the interferometric displacement measuring system and a measuring mirror fixed to the moveable component, and the variable representing beamshear is proportional to at least one of the length of the optical path, the number of passes of the optical path made by the measurement beam, and the angle between the measurement beam and the normal to the measuring mirror.

16. A computer program according to claim 12, wherein the model includes correction terms that are functions of variables representing beamshear in at least two orthogonal directions.

17. A computer program according to claim 12, wherein the correction term is a polynomial in the variable representing beamshear.

18. A computer program according to claim 17, wherein the polynomial is at least second order.

19. A computer program according to claim 12, configured to measure displacements in at least two linear degrees of freedom and the model includes respective correction terms for each of the linear degrees of freedom.

20. A method of calibrating an interferometer for measuring displacements of a moveable object in a lithographic projection apparatus, the method comprising:
   determining displacements as a function of moveable object rotation and moveable object position; and
   determining interferometer model parameters, including coefficients for terms dependent on a variable representing beamshear of a measurement beam, using a least square fit.

* * * * *